United States Patent
Belch (10) Patent No.: US 6,459,321 B1
(45) Date of Patent: Oct. 1, 2002

(54) GATE PROTECTION CLAMPING CIRCUITS AND TECHNIQUES WITH CONTROLLED OUTPUT DISCHARGE CURRENT

(75) Inventor: Mark A. Belch, Merrimack, NH (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/892,652

(22) Filed: Jun. 28, 2001

(51) Int. Cl.[7] .............................................. H03L 5/00
(52) U.S. Cl. ...................................... 327/323; 327/481
(58) Field of Search ............................... 327/108, 111, 327/309, 310, 311, 312, 313, 314, 320, 323, 324, 325, 326, 327, 328, 365, 419, 427, 481, 578

(56) References Cited

U.S. PATENT DOCUMENTS 5,650,737 A * 7/1997 Eilley ........................ 327/108
5,831,466 A * 11/1998 Pulvirenti et al. .......... 327/194
5,999,041 A * 12/1999 Nagata et al. .............. 327/108
6,294,941 B1 * 9/2001 Yokosawa ................... 327/309

* cited by examiner

Primary Examiner—Jeffrey Zweizig
(74) Attorney, Agent, or Firm—Fish & Neave; Joel Weiss (57) ABSTRACT

Gate protection clamping circuits and techniques with controlled output discharge current are provided. Circuits and methods according to the invention are implemented to relatively rapidly disengage single or multiple loads from a power supply without creating thermal overload. This is accomplished by first rapidly shutting OFF the power device coupling the power source to the load, and then further discharging the output capacitance with a substantially smaller, preferably regulated, current. Additional external devices may be added if faster discharge of the output capacitance is desired.

19 Claims, 5 Drawing Sheets

FIG. 1

PRIOR ART

GATE PROTECTION CLAMPING CIRCUITS AND TECHNIQUES WITH CONTROLLED OUTPUT DISCHARGE CURRENT

BACKGROUND OF THE INVENTION

This invention relates to circuits and methods for controlling output discharge current. More specifically, this invention relates to integrated clamping circuits and techniques for controlling output discharge current from an external Field Effect Transistor (hereinafter "FET").

Any integrated circuit that controls an external FET should, and often does, include protection for the FET gate. This protection is needed to limit the voltage differential across the gate dielectric. Excess voltage differential across the gate dielectric may cause oxide breakdown which, in turn, may lead to subsequent failure of the FET.

Figure 1:
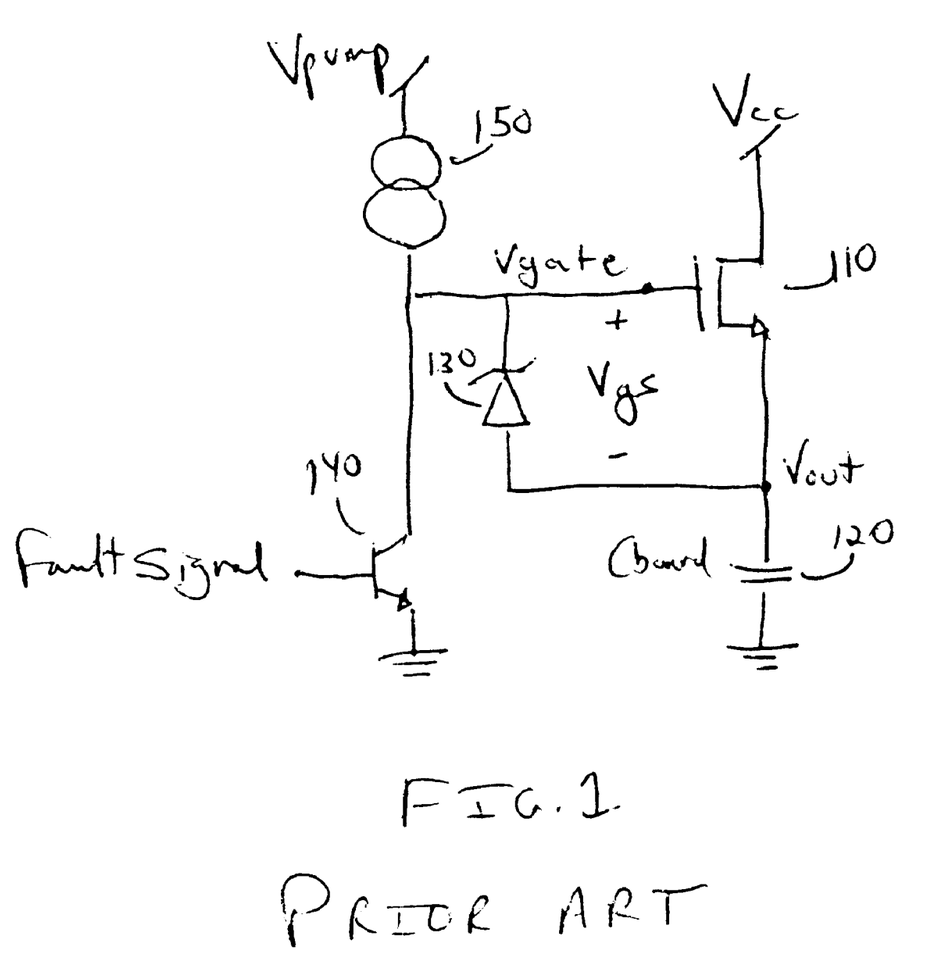
FIG. 1 shows a conventional circuit for connecting a power bus to a load.

One conventional method of providing this protection is to connect a discrete zener diode between the source and the gate of the external FET. FIG. 1 shows a conventional zener diode-clamped circuit 100. Circuit 100 includes FET 110, board capacitor 120, zener diode 130, discharge transistor 140 and current source 150.

Zener diode 130 performs two functions in this circuit. First, zener diode 130 clamps the Vgs (gate-source) voltage in the positive direction—i.e., when the gate has a higher potential than the source—at the zener breakdown voltage (typically between about 8 volts and 20 volts). Second, it clamps the voltage in the negative direction—i.e., when the gate is lower than the source—at the forward diode voltage (typically between about 600 millivolts and 800 millivolts).

This conventional architecture, however, creates certain problems. For example, when an external diode is used to clamp the output in a negative direction—i.e., when Vgate drops below Vout—gate discharge transistor 140 conducts heavily to discharge the gate voltage of FET 110 and the capacitance on capacitor 120. This heavy conduction creates the possibility of thermal overload of discharge transistor 140. Thermal overload of discharge transistor 140 occurs more readily when there is a large capacitance on the output and/or a high Vout, because there is more energy stored in the output capacitor.

It would be desirable to provide integrated clamping circuit and techniques that discharge FETs and/or large capacitances without overloading discharge devices.

SUMMARY OF THE INVENTION

It is an object of the invention to provide integrated clamping circuits and techniques that discharge FETs and/or large capacitances without overloading discharge devices.

One embodiment of a method, according to the invention, for clamping the gate to source voltage of a FET during discharge of the output capacitance of a circuit, which output capacitance may include the capacitance of the FET and the capacitance of an output capacitor, in order to prevent oxide breakdown is as follows. The FET preferably has a gate coupled to an output capacitor. The method includes preferably discharging the FET using a relatively large drive current until the FET is OFF. When the FET is OFF, the method preferably includes providing a feedback signal to reduce the drive current by at least an order of magnitude. When the drive current is reduced, the method preferably includes discharging the output capacitance using the reduced drive current. Finally, the discharging preferably clamps the gate to source voltage of the FET at a pre-determined value.

A circuit according to the invention for discharging an output capacitance, the output capacitance including a gate capacitance of a FET and a distributed board capacitance coupled to the FET source, preferably includes a controllable current source that produces a drive current, the drive current preferably being adapted to partially discharge the gate capacitance and to shut the FET OFF, a clamp circuit that preferably produces a feedback signal during at least a portion of a time that the FET is OFF, this feedback signal preferably causing the drive current to be reduced, the reduced drive current that preferably discharges the stored capacitance. The drive current is preferably regulated at least partially by the feedback signal such that the gate to source voltage of the FET is maintained above a pre-determined minimum value.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

This invention is directed to clamping circuits and techniques that provide a controlled output discharge current. One aspect of the invention is specifically directed to regulating the discharge current conducted by a discharge transistor in the discharge circuit.

A circuit according to the invention may be used in conjunction with a discrete power device, such as a power FET, to couple a power bus to one or numerous loads. The power FET is used to conduct relatively large currents in order to power the load from the power bus. This, which controls the power FET, circuit is commonly referred to as a "hot-swap" circuit. The purpose of a hot-swap circuit is two-fold.

First, the hot-swap circuit protects the load from power spikes, irregularities or other faults in the power bus by discharging the gate capacitance of the power FET when a fault is detected in the power bus. This discharging shuts OFF the FET and, thereby, disconnects the power bus from the load.

Second, the hot-swap circuit protects the power bus from faults in the load—e.g., when the load is accidentally shorted to ground. As with the protection of the power bus, the hot-swap circuit protects the load by discharging the gate capacitance of the FET which, in turn, disconnects the power bus from the load when a fault is detected in the load.

In order to protect the load or the power bus from faults, the hot-swap circuit preferably rapidly discharges the gate capacitance of the discrete power device. The hot-swap circuit must also discharge a capacitance on the circuit board which is found in an output capacitor or board capacitor. This capacitor may be required to stabilize the voltage potential seen by the load. The FET gate capacitance and the board capacitance may be considered as a single output capacitance which must be discharged by the hot-swap circuit in order to shut OFF the FET and disconnect the power bus from the load.

In conventional integrated hot-swap circuits, discharging of the two capacitances which form the output capacitance was typically implemented with a single discharge device—e.g., a Bipolar Junction Transistor (hereinafter "BJT").

As discussed above, discharging the output capacitance which includes the FET gate capacitance and the board capacitance, requires that the discharge device conduct a large current. This large current may be required to turn OFF the FET quickly in the event of a fault in the system. If the current is not reduced in some way, then the temperature rise in the discharge device may cause it to fail catastrophically (or even cause a reduction in reliability) because the hot-swap circuit dissipates the energy that is stored in the board capacitor relatively quickly.

In a circuit according to the invention, when the circuit receives an instruction to shut OFF the FET by discharging the output capacitance, the discharge device initially sinks a large current—e.g., about 150 milliamperes. This pulls the gate voltage down quickly and shuts OFF the FET. The large current is preferably generated by a drive circuit which is capable of sinking the 150 milliampere current.

When the FET shuts OFF, and the voltage at the gate of the power FET drops such that a pre-determined voltage differential is preferably obtained between the gate and the source of the FET, a clamp devices is activated and preferably sends a feedback signal to the drive circuit.

The feedback signal preferably instructs the drive circuit to begin discharging the capacitance on the board capacitor with a reduced drive current. Thus, the drive circuit and the clamp circuit, which may be implemented using controllable current sources such as BJTs, preferably regulate the discharge current whereby neither device overloads, until the circuit is discharged. This ensures that the output capacitance is discharged in a regulated and controlled way. Furthermore, this occurs while the drive circuit substantially continually maintains the FET in an OFF state.

Figure 2:
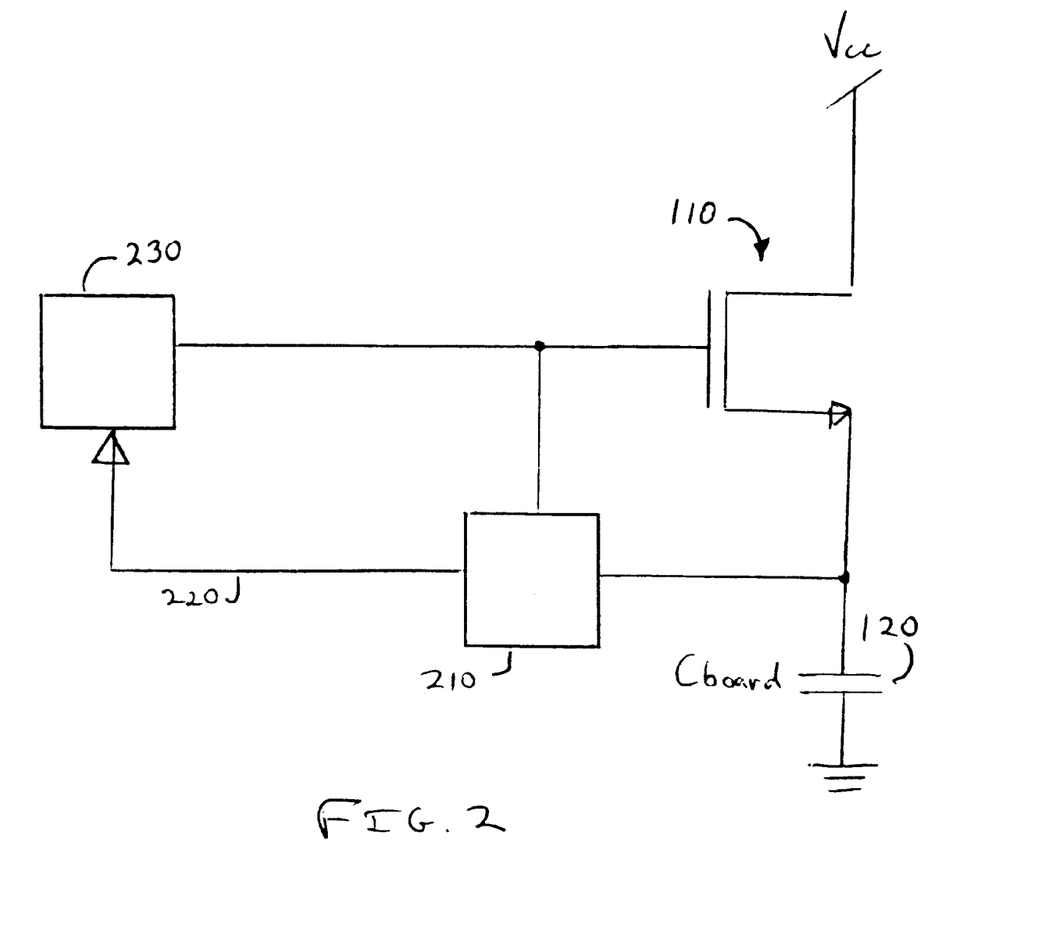
FIG. 2 shows a schematic diagram of a circuit for connecting a power bus to a load according to the invention.

FIG. 2 shows a schematic diagram of a circuit according to the invention including clamp circuit 210, feedback signal 220 and drive circuit 230. The Drive circuit 230 preferably begins discharging FET 110 at a pre-determined time—e.g., when a fault is detected in the Vcc system. Drive circuit 230 continues to discharge FET 110 sufficiently to shut FET 110 OFF. When FET 110 is shut OFF, drive circuit 230 discharges FET 110 further until a pre-determined voltage potential is obtained between the gate and source of FET 110. When the pre-determined gate to source voltage is obtained, clamp 110 preferably sends a feedback signal to drive circuit 230. Drive circuit 230 then reduces the drive current, but continues to discharge the output capacitance (which includes the gate to source capacitance of the FET as well as the distributed board capacitance, Cboard) until the circuit is completely discharged.

Figure 3:
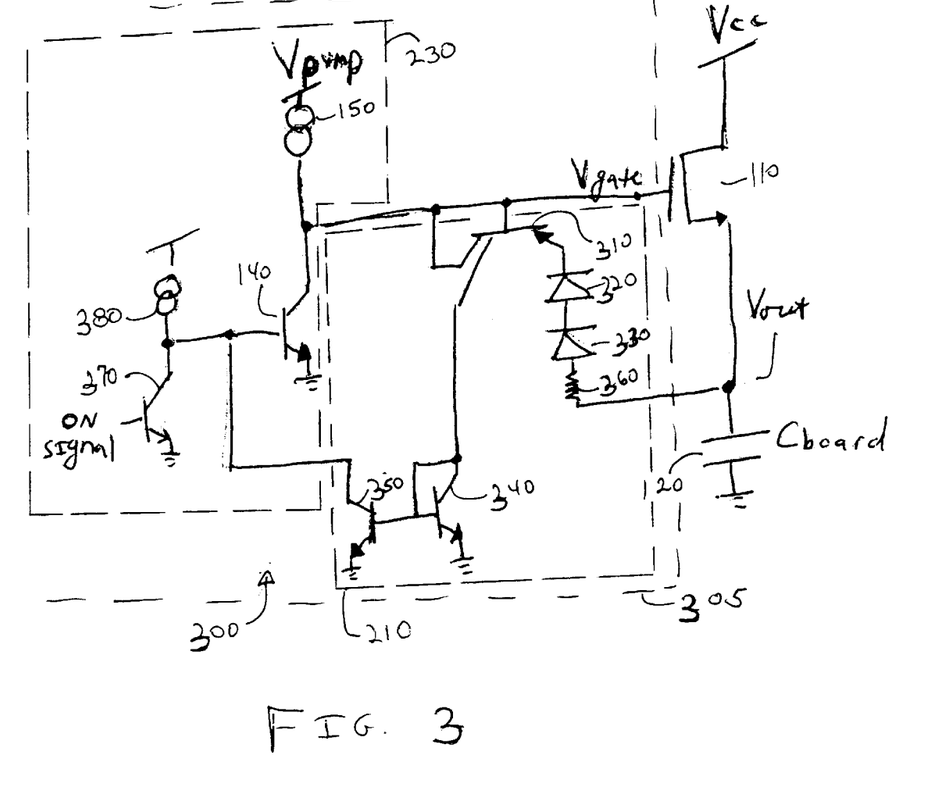
FIG. 3 shows a preferred embodiment of a circuit for connecting a power bus to a load according to the invention.

FIG. 3 shows a more detailed circuit 300 according to the invention. A preferred embodiment of circuit 300 also includes a power device 110, a board capacitor 120, a first drive device 140. Circuit 300 also includes clamp circuit 210 (which preferably includes transistors 310, 340, 350 (transistors 340 and 350 preferably form a current mirror) resistor 360 and diodes 320 and 330) and drive circuit 230 (which preferably includes transistor 140, turn ON transistor 370 and current sources 150 and 380). The outer dotted line delineates the border of the integrated chip 305 that houses the particular circuitry according to one embodiment of the invention.

The detailed operation of circuit 300 is as follows. As long as no fault exists in the system, power device 110 conducts current from Vcc (which may be implemented as a conventional power bus) to Vout (which may be the output to the load being powered by the power device). When a fault occurs in the system, an ON signal goes low—e.g., a low voltage—is transmitted to the base of transistor 370. Transistor 370 is turned OFF, and current from current source 380 is injected into the base of transistor 140. Thereafter, transistor 140 turns ON. (It should be noted that transistor 370 and current source 380 are added to reverse the polarity of the fault signal as it is received by circuit 300. However, the circuit is also functional in the absence of transistor 370 and current source 380, but the fault signal would be received as an OFF signal at the base of transistor 140 instead of an ON signal at the base of transistor 370.)

When device 140 is turned ON with the base current from current source 380 the collector-emitter current of device 140 begins to discharge a portion of the output capacitance by conducting current from Vgate of transistor 110. Device 140 continues to discharge Vgate until transistor 110 shuts OFF. The rate at which Vgate is discharged by device 140 once device 110 has been shut OFF will be explained in detail below.

In this exemplary embodiment, device 140 sinks a current that also activates and governs device 310. This occurs when device 140 increases the gate to source voltage in the negative direction—e.g., when the gate drops with respect to the source, or, alternatively, when the source to gate voltage is increased in the positive direction—of transistor 110 to greater than or equal to 3 Vbe (minus 3 diode drops, each of which is typically between 600 millivolts and 800 millivolts). Device 310 is preferably implemented as a transistor having one collector that is base-connected and is preferably collector-coupled to the portion of device 140 adapted to generate the first discharge current. Once device 310 is activated by a current generated by device 140, its collector-emitter current begins to discharge capacitor 120. The continued operation of device 310—i.e., the magnitude of the base current and the collector-emitter current—is governed in part by the collector-emitter current of device 140. Thus, as device 140 sinks more current, device 310 discharges capacitor 120 more quickly—i.e., with a greater current—and as device 140 sinks less current, device 310 discharges capacitor 120 more slowly—i.e., with a smaller current. It should be noted that the discharge of the gate capacitance of the FET by device 310 may be insubstantial with respect to the discharge of capacitor 120. Rather, the current conducted by device 310 is used substantially to regulate the operation of transistor 140, as will be explained.

At this point in the operation of circuit 300 transistor 110 is OFF, the gate capacitance of transistor 110 is being discharged by a current in the collector-emitter of device 140, and the capacitance of capacitor 120 is being discharged by the current in transistor 140 and, at least partially, by the second current in the collector-emitter of device 340, respectively.

Once device 310 turns ON, the continued discharge operation of transistor 140—i.e., the magnitude of the base current and the magnitude of the collector-emitter current— is controlled in part by a current mirror including transistors 340 and 350 as follows. The current mirror mirrors one of the collector currents (the other collector current of device 310 is used to ensure device 310 is activated) of device 310 in order regulate the discharge operation of transistor 140. When device 310 is activated, it reduces the collector-emitter current in device 140 from about 100 miliamperes to about 150 microamperes. Further operation of device 140 is controlled as follows by device 310: when the current through discharge device 310 increases, the current in the current mirror also increases; when the current through device 140 decreases the current through the current mirror decreases, the available base current to transistor 140 increases, thus increasing the discharge rate of device 140. Therefore, device 140 and device 310 limit one another with respect to how much current each conducts. Furthermore, the regulation of the circuit maintains and limits the discharge of the output capacitance at a level that does not overload either output device or circuit 300 as a whole.

In one preferred embodiment of the invention, the magnitude of the discharge current after activation of device 310 is at least one order of magnitude less than the magnitude of the original drive current in device 140.

It should be noted that device 140 may be considered to be discharging a portion of the capacitance of capacitor 120 through one of the collectors of device 310 (through the collector that is preferably tied to the base of transistor 310.)

It should also be noted that discharge of capacitor 120 preferably occurs in this exemplary embodiment, however, only on the condition that Vout is three diode drops higher than Vgate. The three diode drop differential allows a user to place an additional external transistor to discharge the output capacitance at a rate that is faster than the rate allowed by circuit 300. This embodiment is described below in more detail with respect to FIG. 4.

The three diode-drop is not required and may be subject to design choice depending on the other circuit conditions. Furthermore, resistor 360 may be implemented, as shown in FIG. 3, to further adjust the differential between Vout and Vgate.

Figure 4:
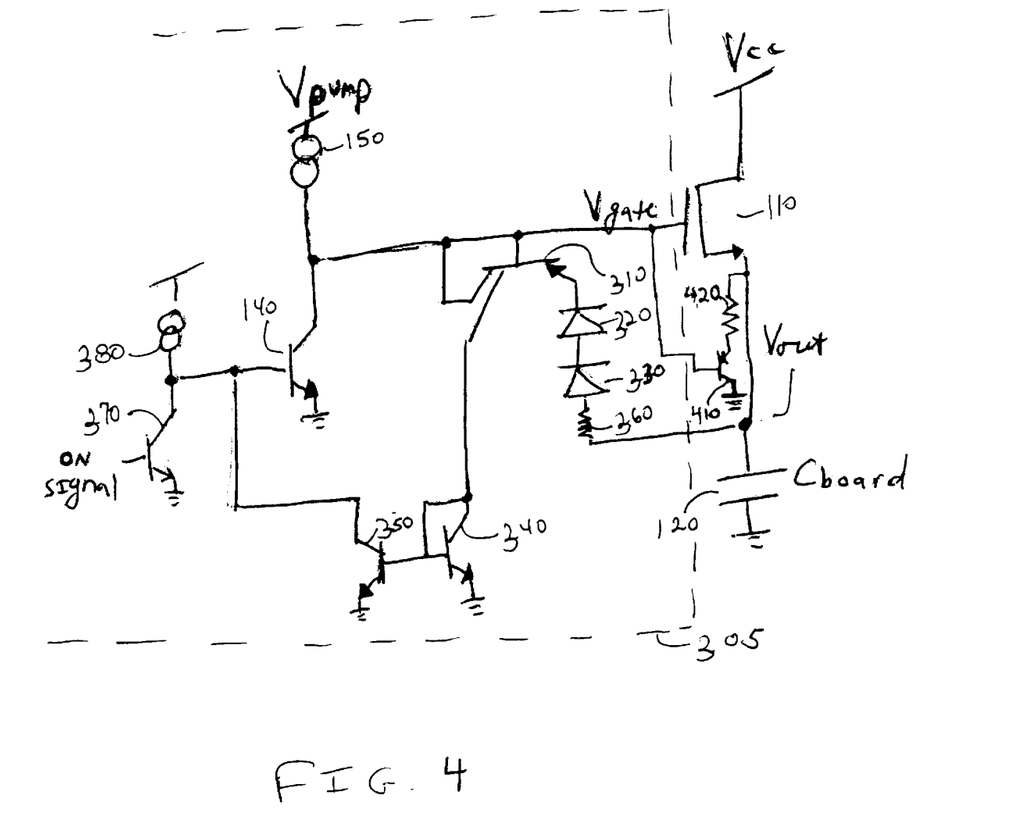
FIG. 4 shows an embodiment of a circuit for connecting a power bus to a load including an external discharge device according to the invention.

FIG. 4 shows another embodiment of a circuit according to the invention. In FIG. 4, external transistor 410 and external resistor 420 have been added to the circuit according to the invention in order to increase the discharge current without thermally loading the integrated circuit. In this embodiment, there will be about a 2 Vbe voltage differential across resistor 420. The ratio of 2 Vbe/resistance of resistor 420 sets the discharge current of the output. This current can be set much higher than the internal discharge currents of the integrated circuit in order to discharge the output much faster. One advantage of this circuit over conventional circuits is that transistor 410 may be implemented with a smaller external device than in conventional circuitry because the integrated circuit is already providing two known discharge currents.

Figure 5:
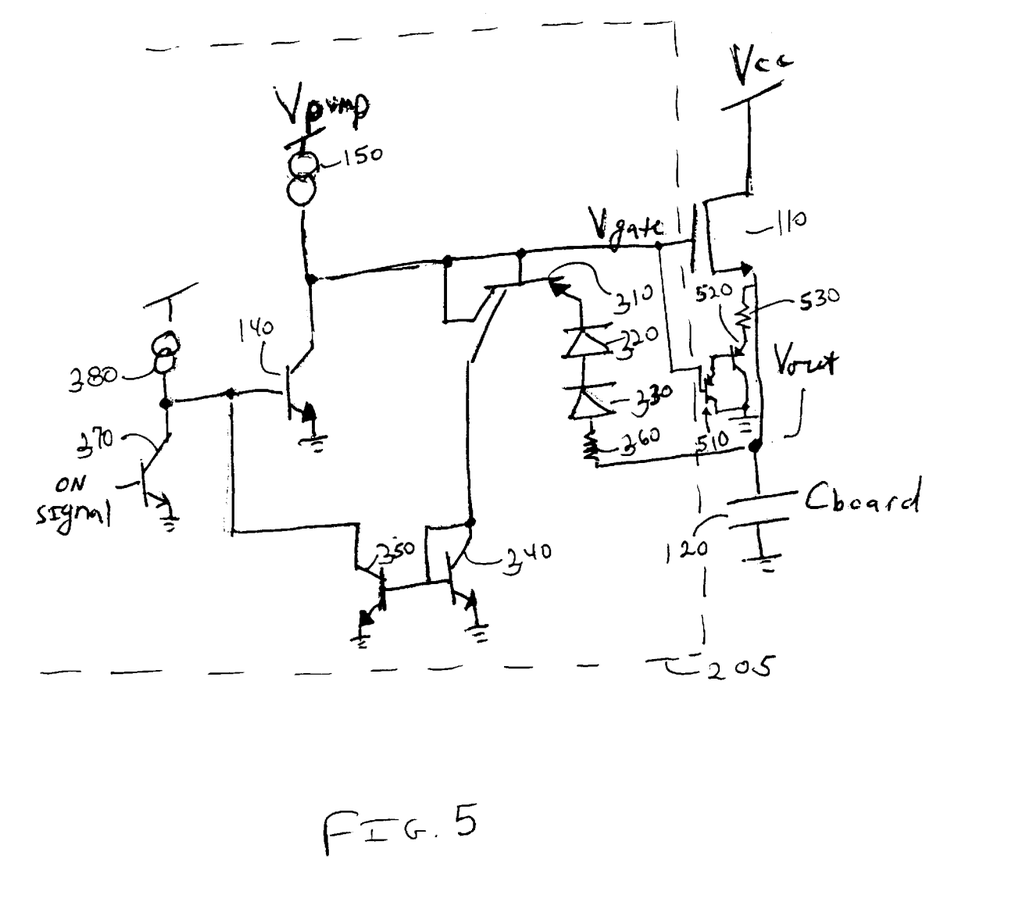
FIG. 5 shows an embodiment of a circuit for connecting a power bus to a load including an external darlington discharge circuit according to the invention.

One limitation on the current through transistor 410 is the beta of transistor 410. If higher discharge current is required than the beta of transistor 410 allows, a darlington configuration of external transistors may be implemented, as shown in FIG. 5. Transistors 510 and 520 are used, together with resistor 530, to relatively quickly discharge the output capacitance of capacitor 120. It should be noted that, when using the darlington configuration, the voltage of the resistor should be implemented at about 1 Vbe instead of two because of the additional Vbe in the darlington transistors.

Thus it is seen that gate protection clamping circuits and techniques with controlled output discharge current have been provided. One skilled in the art will appreciate that the present invention can be practiced by other than the described embodiments, which are presented for purposes of illustration rather than of limitation, and the present invention is limited only by the claims which follow.

What is claimed is:

1. A method of clamping the gate to source voltage of a FET during discharge of the FET in order to prevent oxide breakdown, the FET having a gate coupled to an output capacitor, the gate to source capacitance of the FET and the capacitance of the output capacitor forming an output capacitance, the method comprising:

discharging the FET using a drive current until the FET is OFF;

when the FET is OFF, providing a feedback signal to reduce the drive current by at least an order of magnitude;

when the drive current is reduced, discharging the output capacitance using the drive current wherein the gate to source voltage of the FET is clamped at a predetermined value.

2. The method of claim 1, the discharging the output capacitance comprising using the reduced drive current at a magnitude that is at least one order of magnitude less than the magnitude of the drive current used to discharge the FET.

3. The method of claim 1, further comprising using a portion of the drive current to reduce the drive current.

4. The method of claim 1, further comprising fixing a minimum gate-source voltage of the FET at a predetermined value.

5. The method of claim 1, after the drive current has been reduced, augmenting the drive current by providing an additional discharge current to further discharge the output capacitance, the additional discharge current being activated by the drive current.

6. The method of claim 5, further comprising augmenting the reduced drive current by using a Darlington transistor pair.

7. A method of controlling the discharge current of an output capacitance, the output capacitance including a FET gate capacitance in a FET and a second capacitance, the method comprising:

discharging the FET gate capacitance using a drive current in order to shut OFF the FET and maintain the FET in an OFF state;

when the FET is OFF, providing a feedback signal based on a FET gate to source voltage, the feedback signal indicating that the FET is OFF;

reducing the drive current based on the feedback signal to provide a reduced drive current; and discharging the second capacitance using the reduced drive current.

8. The method of claim 7, the discharging the second capacitance comprising using the reduced drive current at a magnitude that is at least one order of magnitude less than the magnitude of the drive current.

9. The method of claim 7, further comprising activating the reduced drive current using the drive current.

10. The method of claim 7, further comprising fixing a minimum gate-source voltage of the FET at a predetermined value.

11. The method of claim 7, further comprising augmenting the reduced drive current by providing an additional discharge current to further discharge the second capacitance, the additional discharge current being activated by the drive current.

12. The method of claim 11, further comprising augmenting the reduced drive current by using a Darlington transistor pair.

13. An integrated circuit for discharging an output capacitance, the output capacitance including a FET gate capacitance of a FET and a distributed board capacitance that is coupled to the FET source, the circuit comprising:

a controllable current source that produces a drive current, the drive current that is adapted to partially discharge the output capacitance and to shut the FET OFF;

a clamp circuit that produces a feedback signal during at least a portion of a time that the FET is OFF;

the feedback signal which reduces the drive current and, at least partially, regulates the drive current; and wherein the gate to source voltage of the FET is maintained above a pre-determined minimum value.

14. The circuit of claim 13, further comprising a current mirror that mirrors the reduced drive current to create a mirrored current that at least partially regulate the operation of the controllable current source.

15. The circuit of claim 13, when the reduced drive current is flowing, further comprising a fixed minimum potential difference between the gate and the source of the FET.

16. The circuit of claim 13, further comprising an additional current that further discharges the output capacitance and that is activated by the reduced drive current.

17. The circuit of claim 16, further comprising a discrete transistor, the discrete transistor for producing the additional drive current.

18. The circuit of claim 16, further comprising a Darlington transistor pair, the Darlington transistor pair for producing the additional drive current.

19. The circuit of claim 13, wherein the controllable current source is activated by a fault signal.

* * * * *

UNITED STATES PATENT AND TRADEMARK OFFICE
CERTIFICATE OF CORRECTION

PATENT NO. : 6,459,321 B1  
DATED : October 1, 2002  
INVENTOR(S) : Mark A. Belch It is certified that error appears in the above-identified patent and that said Letters Patent is hereby corrected as shown below:

Drawings,
Replace Figure 1 with the following Figure 1

FIG. 1
PRIOR ART

Replace Figure 2 with the following Figure 2

FIG. 2

UNITED STATES PATENT AND TRADEMARK OFFICE
CERTIFICATE OF CORRECTION

PATENT NO.    : 6,459,321 B1
DATED         : October 1, 2002
INVENTOR(S)   : Mark A. Belch It is certified that error appears in the above-identified patent and that said Letters Patent is hereby corrected as shown below:

Replace Figure 3 with the following Figure 3

Replace Figure 4 with the following Figure 4

UNITED STATES PATENT AND TRADEMARK OFFICE
CERTIFICATE OF CORRECTION

PATENT NO.     : 6,459,321 B1
DATED          : October 1, 2002
INVENTOR(S)    : Mark A. Belch It is certified that error appears in the above-identified patent and that said Letters Patent is hereby corrected as shown below:

Replace Figure 5 with the following Figure 5

Signed and Sealed this

First Day of July, 2003

JAMES E. ROGAN
*Director of the United States Patent and Trademark Office*